United States Patent [19]

Brady et al.

[11] Patent Number: 5,488,701
[45] Date of Patent: Jan. 30, 1996

[54] IN LOG SPARING FOR LOG STRUCTURED ARRAYS

[75] Inventors: James T. Brady; Jaishankar M. Menon, both of San Jose, Calif.

[73] Assignee: International Business Machines Corporation, Armonk, N.Y.

[21] Appl. No.: 340,977

[22] Filed: Nov. 17, 1994

[51] Int. Cl.[6] .................................................. G06F 11/34
[52] U.S. Cl. ................................ 395/182.04; 371/10.2
[58] Field of Search ............................. 371/10.1, 10.2, 371/10.3, 2.2, 51.1, 49.1, 48; 395/575, 182.04, 182.05, 182.06, 185.07, 183.18; 364/265.3, 266.4; 365/200

[56] References Cited

U.S. PATENT DOCUMENTS

| | | | |
|---|---|---|---|
| Re. 34,003 | 7/1992 | Weng . | |
| 4,761,785 | 8/1988 | Clark et al. | 371/51 |
| 4,914,656 | 4/1990 | Dunphy, Jr. et al. | 371/10.2 |
| 4,989,205 | 1/1991 | Dunphy, Jr. et al. | 371/10.1 |
| 4,989,206 | 1/1991 | Dunphy, Jr. et al. | 371/10.1 |
| 5,124,987 | 6/1992 | Milligan et al. | 371/10.1 |
| 5,163,023 | 11/1992 | Ferris et al. | 371/10.3 |
| 5,166,939 | 11/1992 | Jaffe et al. | 371/10.2 |
| 5,233,618 | 8/1993 | Glidden et al. | 371/51.1 |
| 5,235,601 | 8/1993 | Stallmo et al. | 371/40.1 |
| 5,258,984 | 11/1993 | Menon et al. | 371/10.1 |
| 5,265,098 | 11/1993 | Mattson et al. | 371/11.1 |
| 5,301,297 | 4/1994 | Menon et al. | 395/425 |
| 5,349,558 | 9/1994 | Cleveland et al. | 371/10.3 |
| 5,418,921 | 5/1995 | Cortney | 364/200 |

OTHER PUBLICATIONS

D. A. Patterson et al., "A Case for Redundant Arrays of Inexpensive Disks (RAID)", Report No. UCB/CSD 87/391, Dec. 1987, Univ. of California, Berkeley, pp. 1–24.
C. V. Crews et al., "Parity Preservation for Redundant Array of Independent Direct Access Storage Device Data Loss Minization and Repair", IBM Technical Disclosure Bulletin, vol. 36, No. 3, Mar. 1993, pp. 473–478.

Primary Examiner—Robert W. Beausoliel, Jr.
Assistant Examiner—Albert Decady
Attorney, Agent, or Firm—Ingrid M. Foerster; Jenkens & Gilchrist

[57] ABSTRACT

In a log structured array (LSA) storage subsystem, a method for recovering from a storage device failure which incorporates the LSA write and garbage collection procedures, thereby simplifying the recovery process and eliminating the need for dedicated or distributed sparing schemes. Data is distributed across the array in N+P parity groups. Upon a device failure, each lost data block is reconstructed from the remaining blocks of its parity group. The reconstructed block is then placed in the subsystem write buffer to be processed with incoming write data, and new parity is generated for the remaining N−1 data blocks of the group. A lost parity block is replaced by first moving one of the data blocks of its parity group to the write buffer, and then generating new parity for the remaining N−1 data blocks. Also disclosed is a storage subsystem implementing the preceding recovery method.

31 Claims, 9 Drawing Sheets

IN LOG SPARING FOR LOG STRUCTURED ARRAYS

FIELD OF THE INVENTION

The present invention relates generally to a log structured array of storage devices, and in particular to a method for recovering from a device failure in a log structured array.

BACKGROUND OF THE INVENTION

Data processing systems generally comprise a central processing unit (CPU) linked to a storage subsystem through an appropriate interface and control system. High performance subsystems include one or more large capacity direct access storage devices (DASDs) such as the IBM 3380 14" disk drive for mainframe computers. High performance subsystems offer the advantages of reliability, high data capacity, and performance. For instance, DASD subsystems can operate for long periods of time before experiencing a device failure. In the event of a device failure, error recovery mechanisms such as disk mirroring assure continuous data availability.

A primary disadvantage of large form factor subsystems is the high cost of DASD. Consequently, an economical alternative has emerged comprising arrays of parallel small form factor disk drives, e.g. the 2½" and 3½" form factor magnetic disk drives commonly used in personal computers and laptops, or the smaller 1.8" ff magnetic disk drives. Small form factor optical disk drives are yet another alternative. Small form factor disk drive arrays emulate large form factor devices, offering advantages such as low cost, small size, and reduced power consumption. Some performance improvements may also be seen due to a large number of actuators performing parallel data accesses. However, the reliability of such arrays is poor because device failures occur more frequently than in large device subsystems.

LOG STRUCTURED ARRAYS

One subsystem array which emulates a large storage device is a log structured array (LSA). An LSA comprises a plurality of segmented storage devices controlled by a subsystem controller with memory. The host system interacts with a logical device residing in the controller memory. To the host, the logical device appears as a large storage device, and the host accesses data using a logical addressing scheme. The logical addresses are mapped into the physical array at the subsystem level so that they are transparent to the host system. An LSA directory is maintained to keep track of the logical track addresses and their corresponding physical array locations. An example of a small form factor LSA subsystem is disclosed in U.S. Pat. No. 5,124,987.

To compensate for poor reliability, a log structured array (LSA) implements a parity protection scheme. Incoming data is broken down into groups of data blocks of predetermined size. A block of parity information is generated for each data group, and the associated data and parity blocks are called a "parity group". Each parity group is "striped", or distributed, across the array such that no two blocks of the same parity group reside on the same device. Striping assures that, at most, only one block of data is lost to a parity group in a single device failure.

GARBAGE COLLECTION

The physical location of data in an LSA changes over time. For example, the host may retrieve data from a logical address, then return it to the same logical address. However, the modified data is generally not returned to the same physical array location from which it was retrieved. Rather, it is received into a write buffer with new write data and eventually becomes part of a new parity group which is written to a free segment of the array.

Over time, data movement in an LSA creates "holes" of invalid data. These "holes" are consolidated into free array segments with a background garbage collection procedure implemented by the subsystem controller. Segments are selected for garbage collection based on predetermined criteria, such as a threshold number of invalid data tracks per segment or inactivity in the segment. All valid data remaining in the segment is read into the data buffer, and the segment is tagged as free. The valid data is then processed in the same manner as new write data.

DATA RESTORATION PROCESS

Subsystems protected with parity require the reconstruction of lost data. A lost block of data or parity is reconstructed from all remaining blocks of the same parity group. Data blocks are reconstructed, for example, by retrieving the remaining data and parity blocks of the same parity group from the array and logically exclusive OR-ing them to form a new data block. Parity is restored, for example, by retrieving all of the data blocks of the parity group from the array and exclusive OR-ing them to generate a new parity block. Reconstructed blocks are placed in spare space within the subsystem, and their new locations are recorded in the LSA directory.

In a conventional subsystem array, spare space is reserved for data reconstruction in one of two ways. A first approach is to provide "dedicated spares", i.e. additional devices within the array reserved exclusively for data restoration. When a device failure occurs, information residing on the failed device is reconstructed and written to the spare device.

An alternative sparing approach is "distributed sparing", wherein spare segment columns are reserved across multiple devices of the array. Commonly assigned U.S. Pat. No. 5,258,984 describes one such distributed sparing method. Having spare space distributed within the array devices offers a number of advantages over a dedicated sparing approach. First, because all devices of the array are in use, overall system performance is improved. Moreover, spare devices which are inoperative will be discovered immediately, rather than at a point when data reconstruction is required. Yet another advantage is improved performance in subsystems with asynchronous actuators, since data restoration is performed in parallel operations. However, distributed spares further reduce the data capacity of a subsystem which already provides free space via garbage collection procedures.

What is needed is a method for using segments freed in the garbage collection process of an LSA for data reconstruction in the event of a device failure, eliminating the need for additional distributed spare space.

SUMMARY OF THE INVENTION

It is therefore a principal object of the present invention to use the segments available in a log structured array as spare space in the event of a storage device failure, thereby using array space more efficiently and eliminating the need for dedicated or distributed sparing schemes.

Another object of the present invention is to integrate the garbage collection and write processes into the error recovery procedures of an LSA by treating reconstructed data in the same manner as new and modified data.

A further object of the present invention is to provide a flexible subsystem architecture wherein device failures and the addition or removal of devices from a subsystem array is easily tolerated.

Accordingly, the present invention is directed to a method for recovering from a device failure in a log structured array, wherein reconstructed data is treated in the same manner as write data to simplify the error recovery process, and sufficient free space is maintained in the subsystem to accommodate both new write data and anticipated device failures.

A log structured array includes N+P physical storage devices such as magnetic disk, optical drives, or a combination of drive types. The array is structured into M segments, and a varying number of these are free at any one time. Data is stored in the subsystem as a plurality of N+P parity groups striped across the array, each group occupying one segment.

At all times, a sufficient amount of free space is maintained in the array to accommodate reconstruction of at least M-f data blocks, where f is a variable representing the current number of free segments, in the event of a device failure. In other words, a minimum of (M-f)/N segments worth of free space must be kept available for data reconstruction in order to recover from a single device failure. This is preferably done by limiting the number of logical addresses that are mapped to the physical devices. The free space is consolidated into free array segments using a standard LSA garbage collection procedure.

When a disk drive of the array fails, two procedures are initiated: 1) lost data blocks are reconstructed, placed into a data buffer, and then written to the subsystem in the same manner as write data from the host; and 2) each N+P parity group of the array is converted to an N−1+P parity group so that accurate parity information is maintained. The removal of a working device from the array is handled in the same manner as a device failure. When a failed drive is later replaced, the array is reconfigured as an N+P array either through the normal write processing, or by providing special procedures to perform the conversion on the spot.

BRIEF DESCRIPTION OF THE DRAWING

The foregoing and other objects, features and advantages of the present invention will be apparent from the following detailed description of the preferred embodiments of the invention, and from the accompanying figures of the drawing.

DESCRIPTION OF THE PREFERRED EMBODIMENT

Figure 1A:
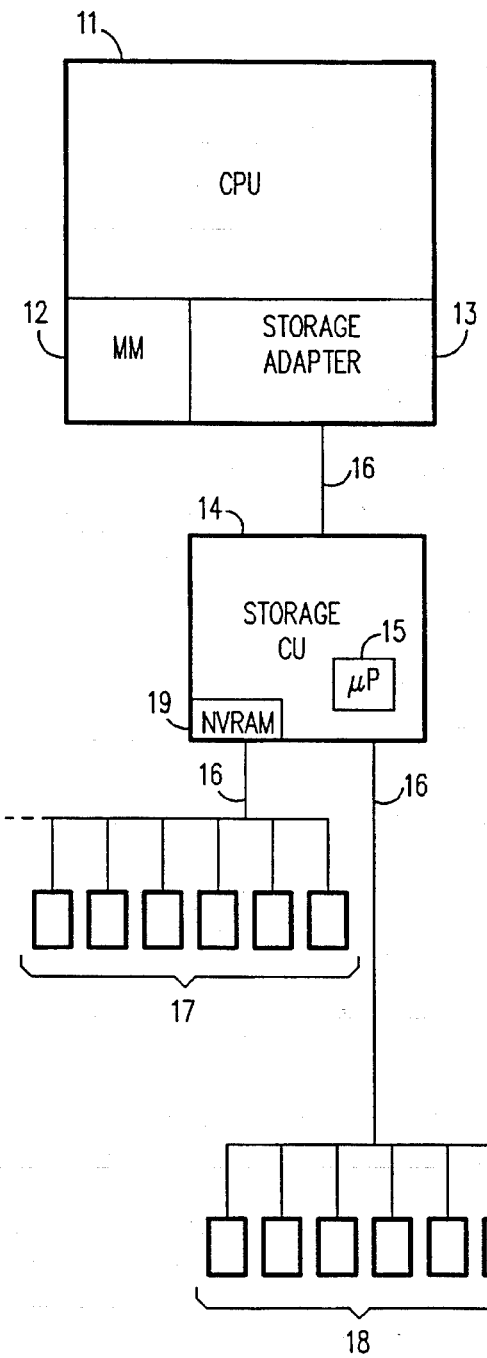
FIGS. 1(a) and (b) are examples of small form factor storage subsystem arrays linked to a CPU through an appropriate interface.
Figure 1B:
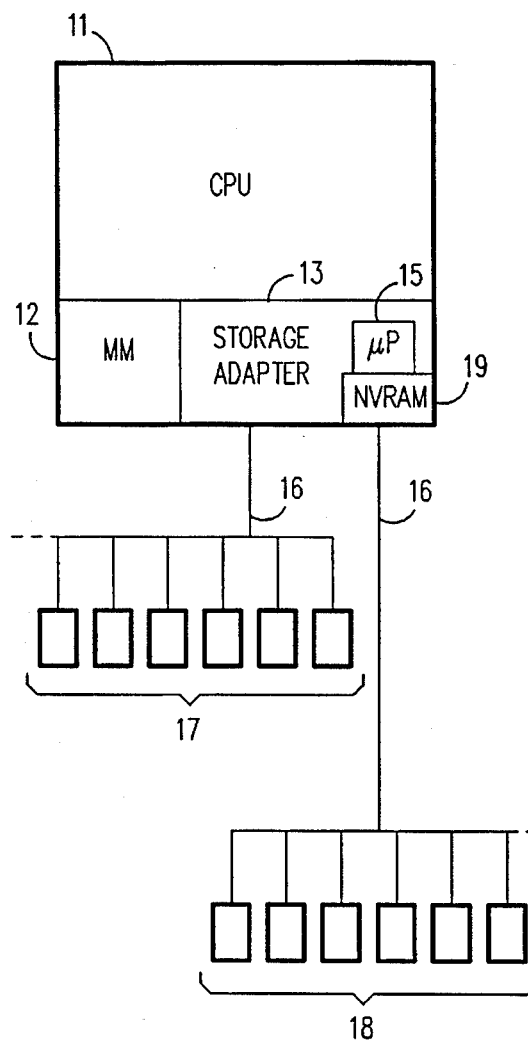
FIG. 1(c) is a representation of a storage device array in a subsystem such as that shown in FIGS. 1(a) and 1(b)

The device failure recovery procedure of the present invention will now be described with initial reference to FIGS. 1(a) and 1(b), showing two known architectures for linking a host computer central processing unit (CPU) 11 to an array subsystem. In FIG. 1(a), a host CPU 11 includes main memory 12 and a storage adapter 13 through which it communicates with the subsystem. The subsystem comprises a storage control unit 14, including a microprocessor 15 and nonvolatile RAM (NVRAM) 19, and one or more storage device arrays 17,18. The system shown may, for example, be an IBM AS/400 mid-range computer linked to an IBM 9337 subsystem through a SCSI interface 16. The IBM 9337 supports a RAID 5 array architecture and may be adapted to an LSA. The device arrays 17,18 may be a plurality of 3½ inch magnetic disk drives linked to the storage control unit 14 through a SCSI interface 16.

Alternatively, the host computer may link directly to an array subsystem without a separate storage control unit 14, as shown in FIG. 1(b). In this configuration, the CPU includes main memory 12, and a storage adapter 21 with a microprocessor 15 and nonvolatile RAM 19 for controlling direct communication with the device arrays 17,18. The CPU adapter may, for example, be a Mylex DAC960P RAID adapter customized to support a log structured array and connected to a plurality of 3½ inch device arrays through multiple channel SCSI interfaces 16.

A subsystem controller manages reads and writes to the array. The controller resides in the storage control unit 14 of FIG. 1(a), or the storage adapter 13 of FIG. 1(b) in cooperation with on-board controllers in the devices (not shown). The on-board controllers communicate with one another, e.g. through a SCSI bus.

Figure 1C:
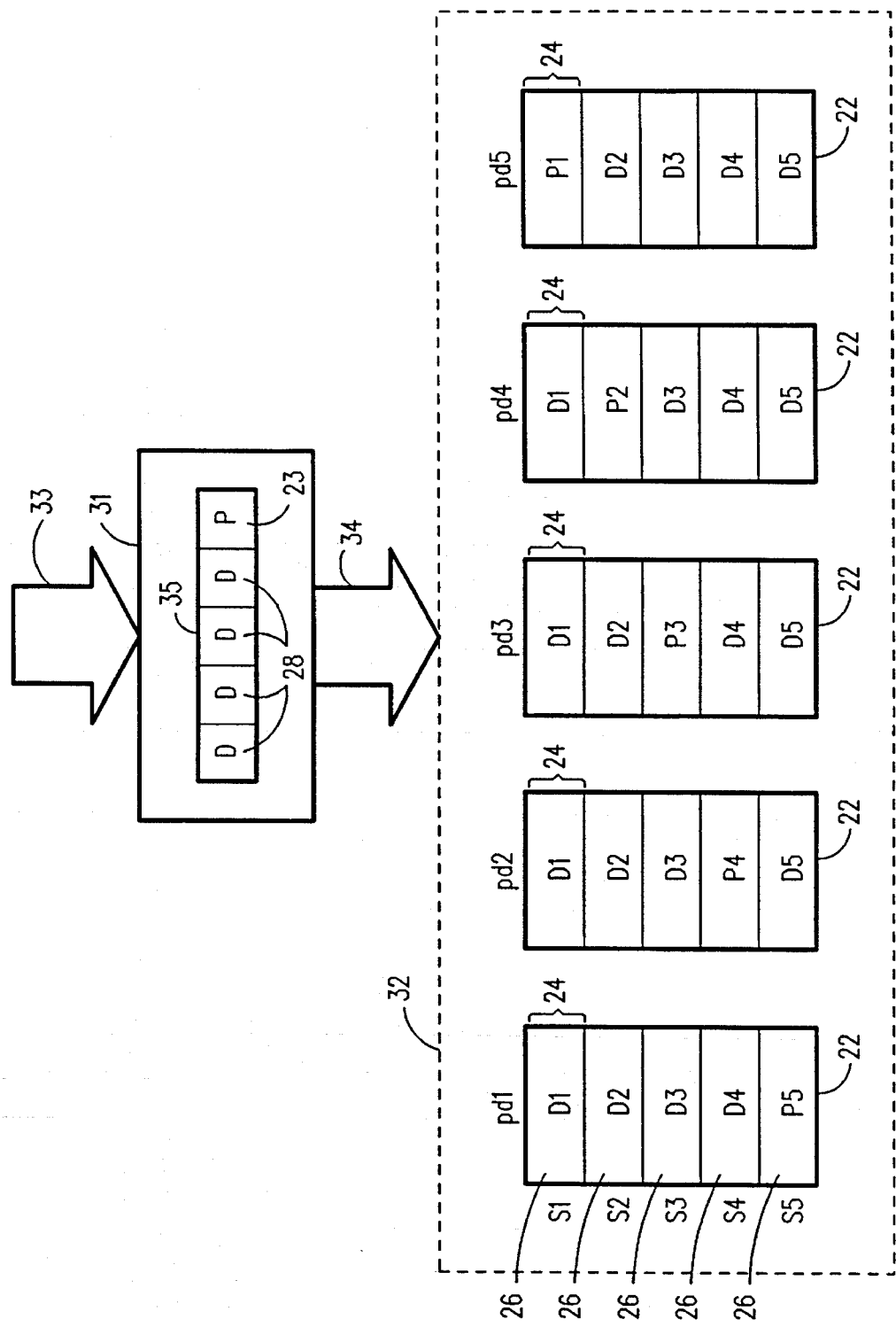

An example of an N+P device array is shown in FIG. 1(c). It includes five physical storage devices 22, pd1–pd5, each subdivided into five contiguous regions or segment columns 26. Preferably, each segment column is the size of a physical cylinder. Rows of segment columns at corresponding locations across the devices form array segments, S1–S5. For example, segment S1 comprises each first segment column 24. Five devices and five segments are shown for illustration purposes. However, it will be understood that a subsystem array may include any number of devices, and each device may include thousands of segments.

Write data from the CPU is represented by arrow 33. In an LSA architecture, the write data is first received into a write buffer 35, preferably in the nonvolatile RAM 31 of the subsystem controller. The buffer is typically the size of an array segment, and is configured to include N+P blocks. Each block is assumed to be the size of a segment column. However, it will be understood by those skilled in the art that these blocks could also be smaller or larger than a segment column of the array. When the buffer is full, a parity block 23 is generated from the data blocks 28 to form a parity group. Parity groups are striped across the array such that no two blocks of the same parity group reside on the same device. For example, segment S1 of FIG. 1(c) contains the parity group including data blocks D1 and parity block P1. Segment S2 contains the parity group comprising data blocks D2 and parity block P2, and so forth. Preferably, parity blocks are distributed for the reasons discussed previously. For distributed parity schemes, a parity table may be maintained in NVRAM 31 listing each segment and the physical location of its parity block. Alternatively, the address of the parity block may be calculated algorithmically.

Figure 2:
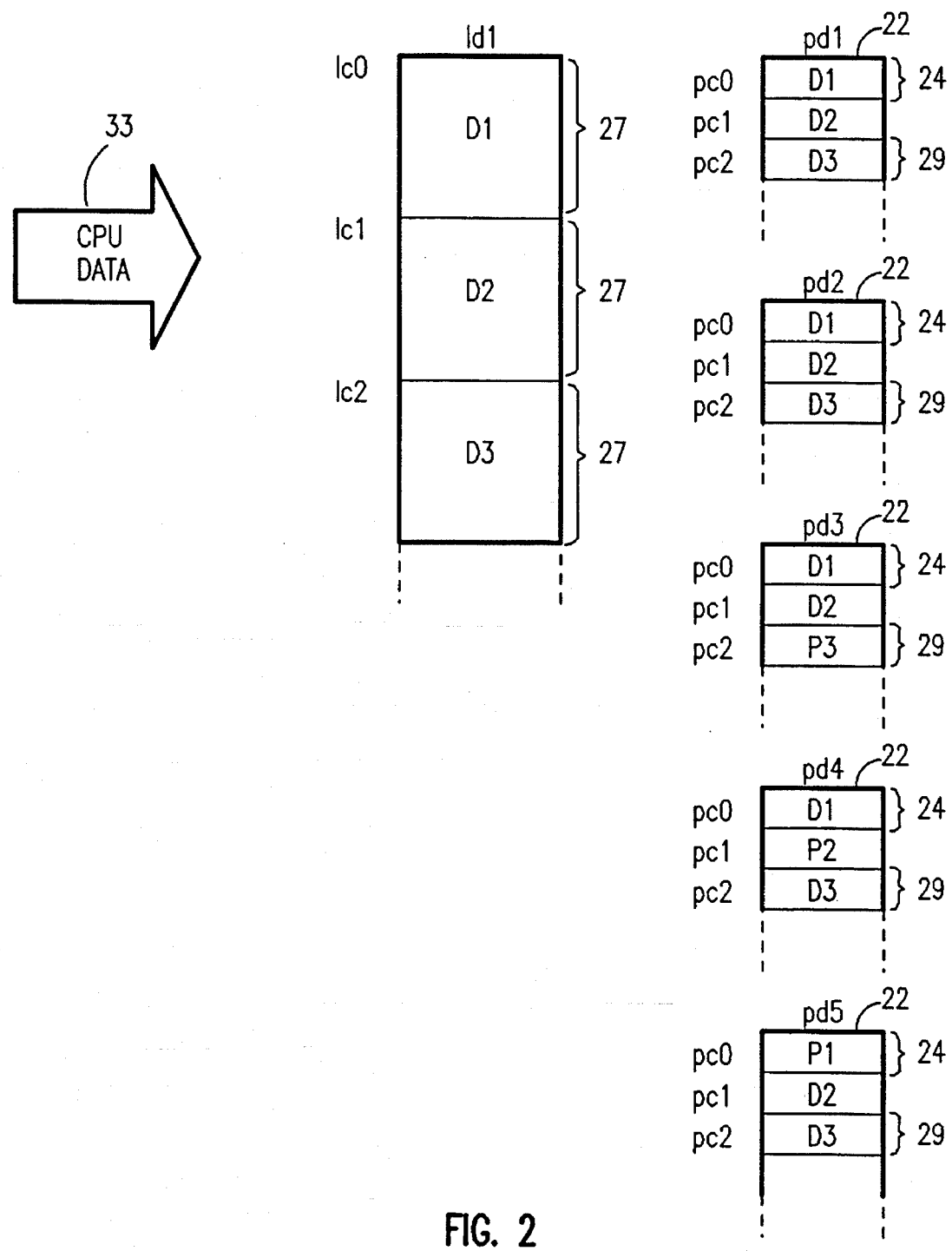
FIG. 2 illustrates the RAID approach to mapping a logical device into a plurality of physical storage devices in a RAID array.

The CPU views an array subsystem as one or more logical devices. A logical device 21, 1d1, is represented in FIG. 2. It physically resides in subsystem memory and for illustration purposes comprises three logical cylinders 27, 1c0–1c2. It will be understood by those skilled in the art that a logical device may actually include thousands of logical cylinders. Incoming write data is represented in FIG. 2 by arrow 33. The CPU writes data to logical tracks of the logical device. Each logical cylinder holds a plurality of logical tracks, which may be of a fixed size, or may vary if the data is first compressed. The designations D1, D2 and D3 represent blocks of data stored in the respective logical cylinders. For illustration purposes, each logical block is four times the size of a physical cylinder.

Logical tracks are mapped to the physical addresses of a device array by the subsystem controller. Mapping is transparent to the CPU, since the CPU accesses data by logical address. A mapping algorithm is typically used to calculate the physical array address corresponding to each logical track address.

Mapping algorithms differ significantly between RAID arrays and LSA's. For example, the array shown in FIG. 2 is a RAID 5 array comprising five physical devices 22, pd1–pd5. Each device includes a plurality of physical cylinders, pc0–pcn, and corresponding device cylinders form array segments.

Data from each logical cylinder is striped across the RAID array 32 such that the contiguous relationship of the data in the logical device is preserved. For example, the data from logical cylinder 1c0 has been sequentially mapped to the first cylinders of devices pd1–pd4. The first cylinder of device pd5 contains a parity block corresponding to the data. Logical cylinders 1c1 and 1c2 have similarly been mapped to segments S2 and S3, and the parity blocks, P1–P3, are distributed.

Figure 3:
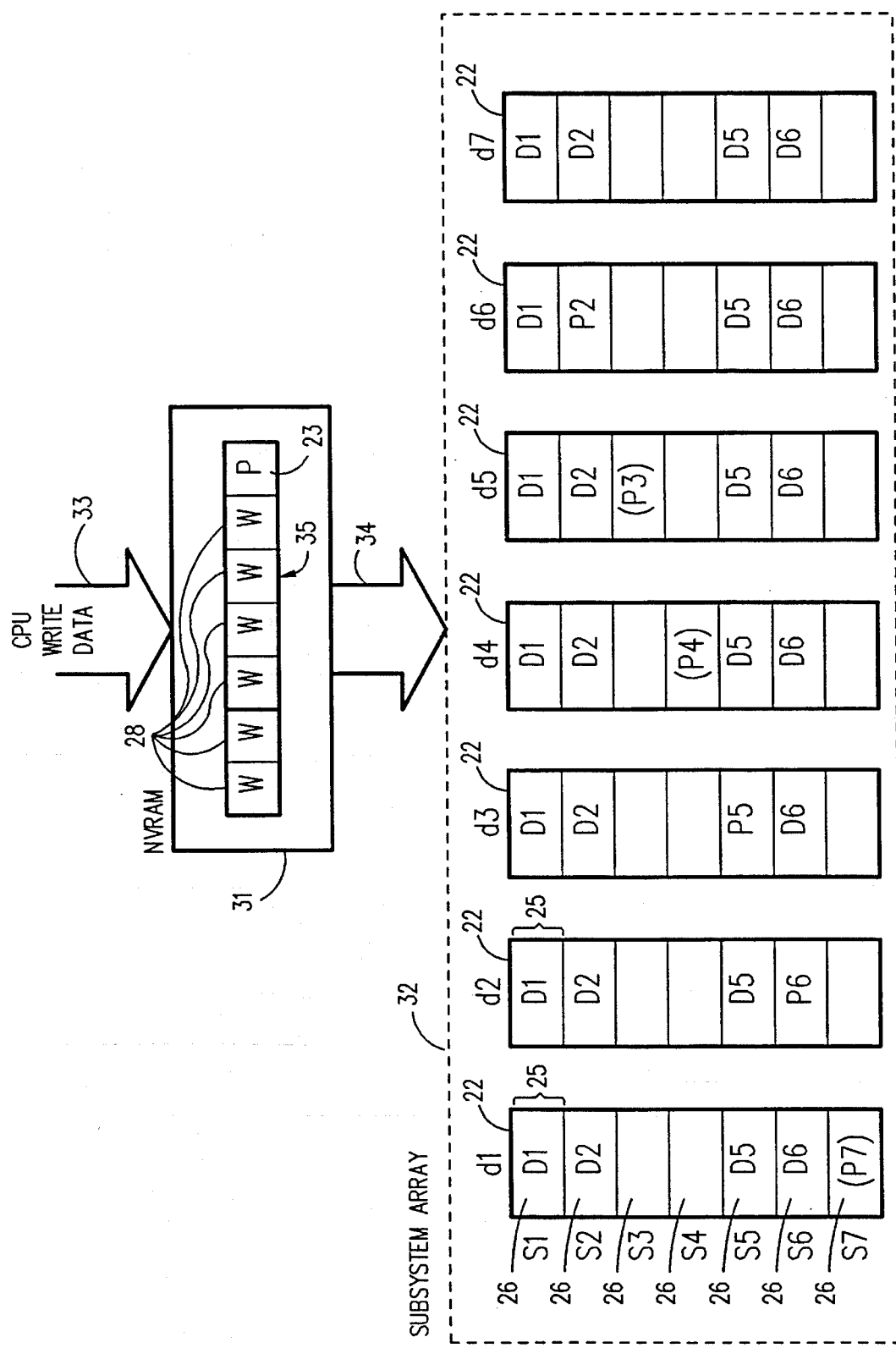
FIG. 3 is a representation of a log structured array.

In contrast, mapping in an LSA is dynamic, and is driven by space requirements rather than the desire to maintain contiguous data. For example, a subsystem array is shown in FIG. 3, including seven devices and seven segments. Each block of a parity group is the size of a physical cylinder for illustration purposes. Segments S1, S2, S5 and S6 are not available because they already contain parity groups. Segments S3, S4 and S7, however, remain free. New, compressed write data is received into write buffer 35, which preferably resides in nonvolatile RAM (NVRAM) 31. The write buffer 35 is preferably the size of an array segment.

When the write buffer 35 becomes full of data 28, a parity block 23 is generated, e.g. by exclusive OR-ing all of the data blocks in NVRAM. The new parity group is then written to one of the free segments still available in the LSA 32. Free segments are always maintained in the LSA for new parity groups using a known garbage collection procedure. A dynamic mapping table, or "LSA directory", is maintained in NVRAM for keeping an updated list of the logical track addresses and their mapped physical addresses. Whenever a new parity group is written to the array, the LSA directory is updated with new physical address information.

Another significant difference between RAID arrays and LSA's is the procedure for modifying data within the array. The write penalties of a RAID array are well-known. For example, referring back to FIG. 2, it will be assumed that a track of data residing in physical cylinder pc0 in device pd1 has been modified. For performance reasons, each data block D1 of devices pd1–pd5 comprises a plurality of subblocks having a corresponding parity subblock on device pd5. An update to physical cylinder pc0 requires that the subblock(s) containing the modified track and its corresponding parity subblock be read into a data buffer. A new parity subblock would then be generated, and the new and modified subblocks would be returned to their physical locations.

Updates to an LSA avoid some of the overhead associated with updates to RAID subsystems. It will be assumed, for example, that a track of data from the array of FIG. 3 has been modified. The modified track is simply placed into the write buffer to be processed with other incoming write data. The old data track remains at its present location in an array segment so that parity information does not require updating. However, the physical address of the old track in the LSA directory is replaced with its new location, thus invalidating the old data. Additionally, an invalid track count associated with the array segment is incremented. When a threshold number of tracks in a segment are invalid, a garbage collection procedure is invoked. Valid tracks are transferred from the segment to the data buffer 35 and processed with incoming write data, and the segment is marked as free. Generally, a segment is "marked" by maintaining a table of free segments in memory.

Presently, both LSA's and RAID arrays handle device failures in substantially the same manner. When a failure occurs, each lost block of the failed device is restored by fetching the remaining data and parity blocks of the same parity group into a data buffer and reconstructing the lost block, e.g. by exclusive OR-ing the fetched blocks together. The restored block is then placed on a distributed or dedicated spare. In a RAID array, the addressing algorithm is modified to update the block's new location. In an LSA, the physical address of the block is updated in the LSA directory.

The present invention is a method for recovering from a single device failure in an LSA which incorporates existing LSA procedures into the recovery procedure and hence eliminates the need for dedicated or distributed spares. According to a first aspect of the invention, the existing garbage collection and write processes are used to process reconstructed data blocks. In a conventional LSA, new parity groups can include three types of data: new write data, modified data; and valid data transferred to the write buffer during garbage collection. According to the present invention, new parity groups may also include reconstructed data blocks. Implementation of this aspect of the present invention requires that a sufficient amount of free space is maintained in the array to accommodate the additional data type. This may be accomplished, for example, by reducing the size or number of logical devices to be mapped to the physical array. According to a second aspect of the invention, parity information is updated for the surviving blocks of a parity group by converting each N+P parity group of the array into an N+P–1 parity group.

Figure 4:
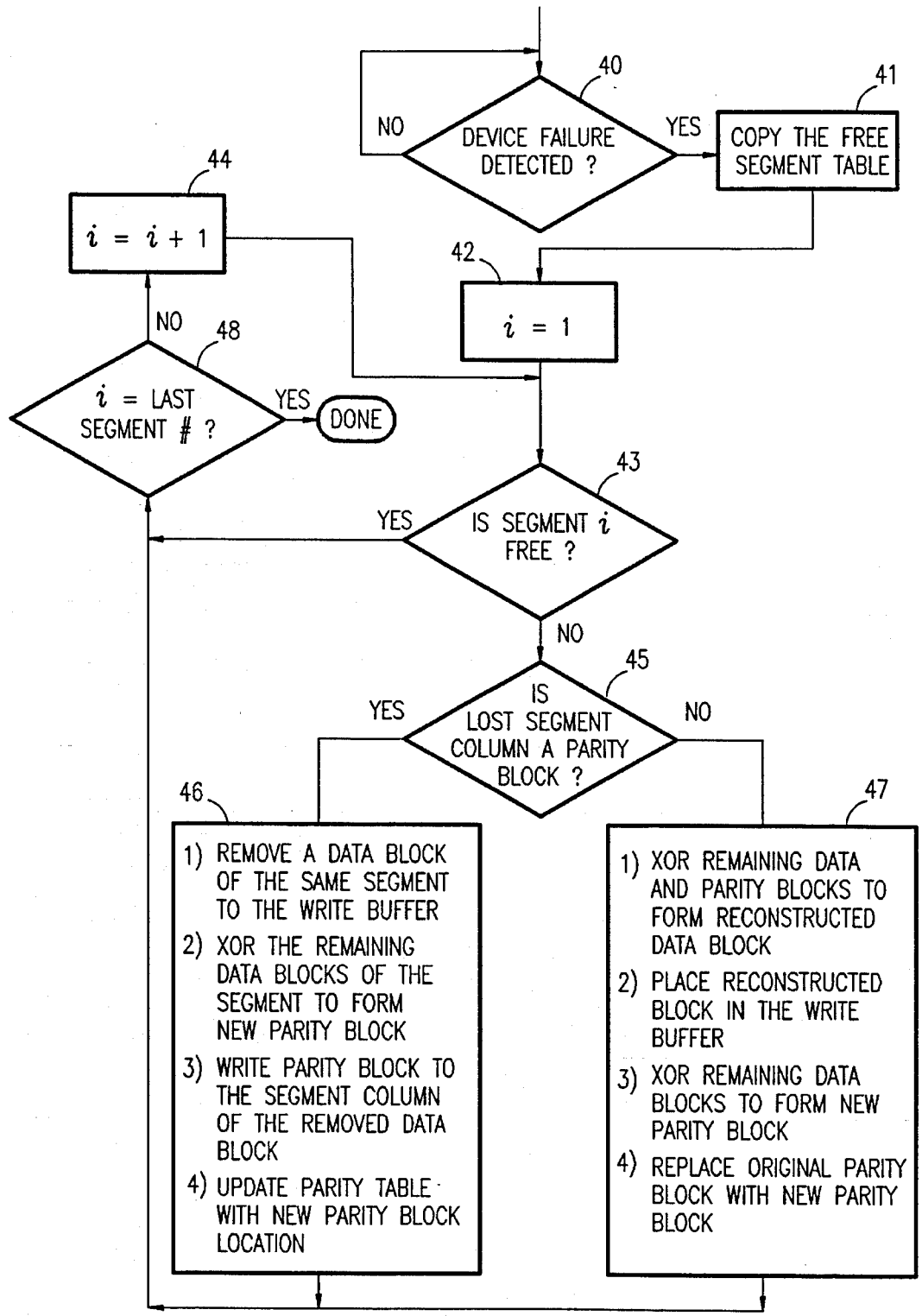
FIG. 4 is a flow diagram of the recovery procedure of the present invention.

FIG. 4 is a flow diagram depicting the data recovery procedure according to the present invention. Device failures are detected according to presently known methods, e.g. detection of an uncorrectable error by the error correction code (ECC), or the failure of the device to respond. Upon the detection of a single device failure 40, a "snapshot" or copy of the free segment table is made to preserve its state at the time of the failure (step 41). Next, each segment of the array is checked by looping algorithm 42,43,48,44 to determine if it holds a parity group, e.g. by looking up the current segment in the snapshot free segment table. If the current segment is determined to be a free segment, the looping algorithm proceeds to the next segment of the array and performs the same lookup procedure. If the current segment is not listed in the free segment table, it is assumed that a parity group resides within that segment, and that a segment column of data or parity has been lost to that parity group.

In the next step 45, a determination is made as to whether the lost segment contained parity or data. Preferably, the determination is made by comparing the physical address of the lost segment column to the physical address of the parity segment column of the current segment. This address may be determined algorithmically or reside in a distributed parity table. If the lost segment column address does not match the parity segment column address, it is assumed that the lost block contained data. The procedure then advances to the next sequence of steps 47.

First, the remaining blocks of the parity group are transferred to a data buffer in subsystem RAM to reconstruct the lost data block, e.g. by XOR-ing the surviving blocks. The reconstructed block is then placed in the write data buffer, which is reduced in size by unallocating one segment column to adjust to the reduced array segment size, and is processed with incoming write data. The reconstructed block will eventually become part of a new parity block and will be written to a free segment of the array. Once reconstruction is complete, the contents of the current segment is converted from an N+P parity group into an N+P−1 group in the following manner. New parity is generated for the surviving data blocks of the parity group, preferably by XOR-ing the surviving data blocks which have already been transferred to the data buffer. The newly generated parity block is then transferred to the array segment to replace the original parity block.

If the lost segment column is found to be listed in the parity table, it is assumed that a parity block has been lost, and the process advances to an alternative sequence of steps 46. First, one data block of the parity group is removed to the write buffer, thereby freeing a segment column for a new parity block. The removed data block is processed with the incoming write data and will eventually become part of a new parity group. Next, the remaining blocks of the segment are transferred to a data buffer and a new parity block is generated therefrom, e.g. by XOR-ing the contents of the buffer. The new parity block is then placed in the freed segment column. Thus, the preceding steps convert the contents of the segment from an N+P parity group into an N+P−1 group.

Upon completion of one of the preceding sequences, the procedure advances to the next step 48 and compares the current segment number to the last array segment number. If the numbers match, the recovery procedure is complete and the process terminates. Otherwise, the procedure advances to the next array segment (step 44), and the entire sequence of steps is repeated. When the failed drive is replaced, the N+P−1 parity groups are converted back to N+P groups, e.g. through the normal write process.

Figure 5:
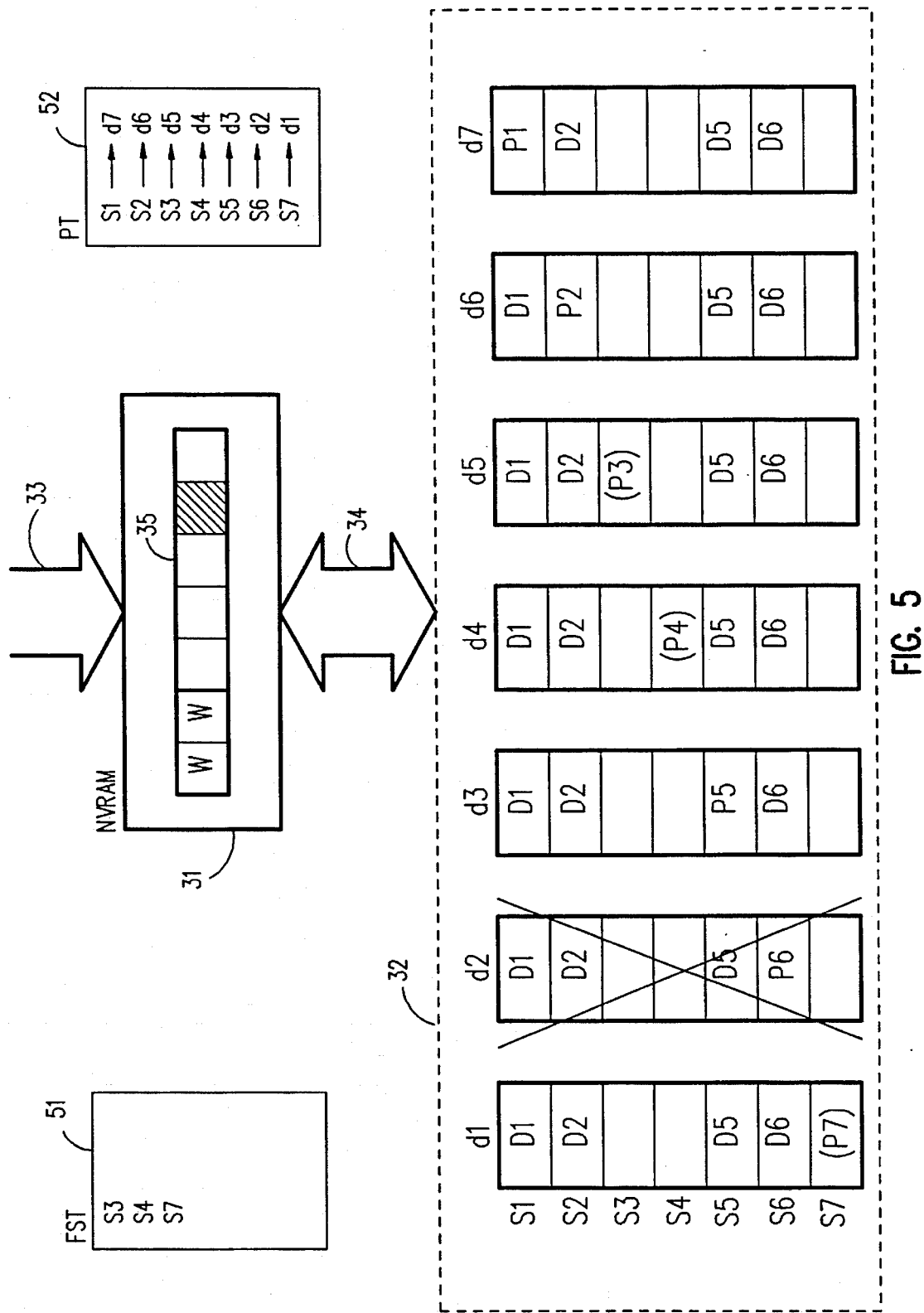
FIGS. 5–8 illustrate a specific example of the recovery procedure of the present invention applied to the LSA of FIG. 3.

An example of the preferred recovery procedure will now be described with reference to FIGS. 5–8. FIG. 5 shows the subsystem 32 of FIG. 3 with a failure indicated on device d2, the write buffer 35, and a parity table listing each segment and its corresponding parity block location. The write buffer has been decreased in size by one segment column in response to the device failure, and already contains some new write data, designated by W's. Bi-directional arrow 34 represents transfers between the write buffer 35 and the array 32.

Figure 6:
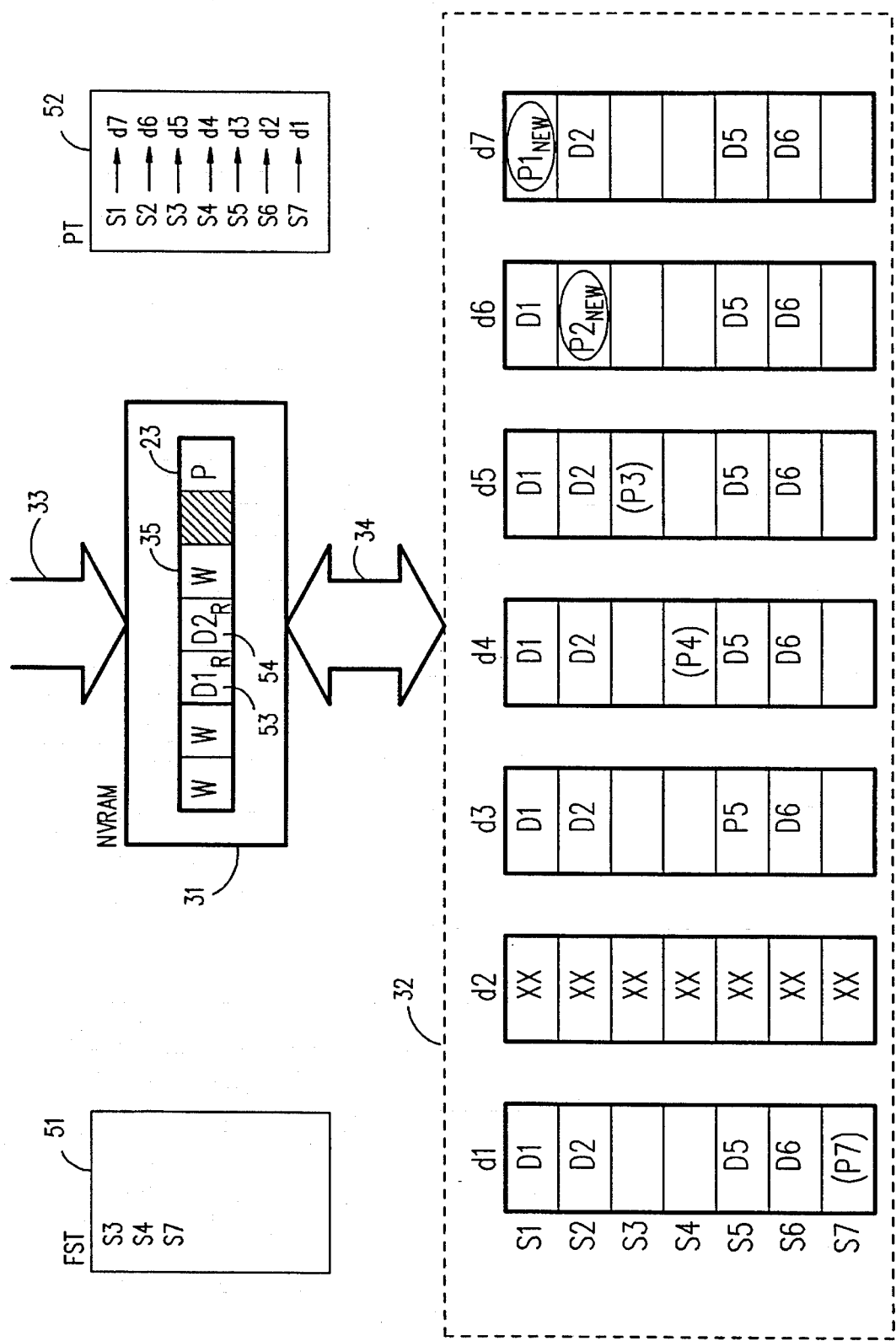

A failure on device d2 causes the loss of three data blocks, D1, D2, and D5, and one parity block, P6. Upon detection of the failure by the subsystem controller, the recovery process of FIG. 4 is invoked. First, the state of the free segment table at the time of failure is preserved in some way, e.g. by making a "snapshot" copy 51 of the table in memory. Segment S1 is checked against the free segment table 51, and a determination is made that S1 is not listed. The failed device number is then compared with the device number corresponding to segment S1 in parity table 52. Since no match is found, a determination is made that the lost block in S1 is a data block, and the appropriate restoration sequence 47 of FIG. 4 is executed. Referring now to FIG. 6, the lost data block is reconstructed according to known methods such as those discussed previously. The reconstructed block, $D1_R$ 53, is placed into the next available location of the write buffer 35, as shown. It will be processed with incoming write data and will eventually form part of a new parity group. A parity block is generated for the remaining data blocks of the segment, according to known methods such as those already discussed. The newly generated parity block, $P1_{new}$, is placed in the first segment column of device d7, replacing the old parity block of segment S1. Having completed the restoration sequence, the current segment number, S1, is compared to the last segment number, S7. There is no match, so S2 becomes the current segment. Restoration in segment S2 is essentially the same as that described for segment S1. Upon determining that S2 is not a free segment and that the lost block contains data, a new data block, $D2_R$ 54, is constructed and placed in the write buffer 35. New parity is generated for the surviving data blocks of the segment and is placed in the second segment column of device d6 as shown.

Figure 7:
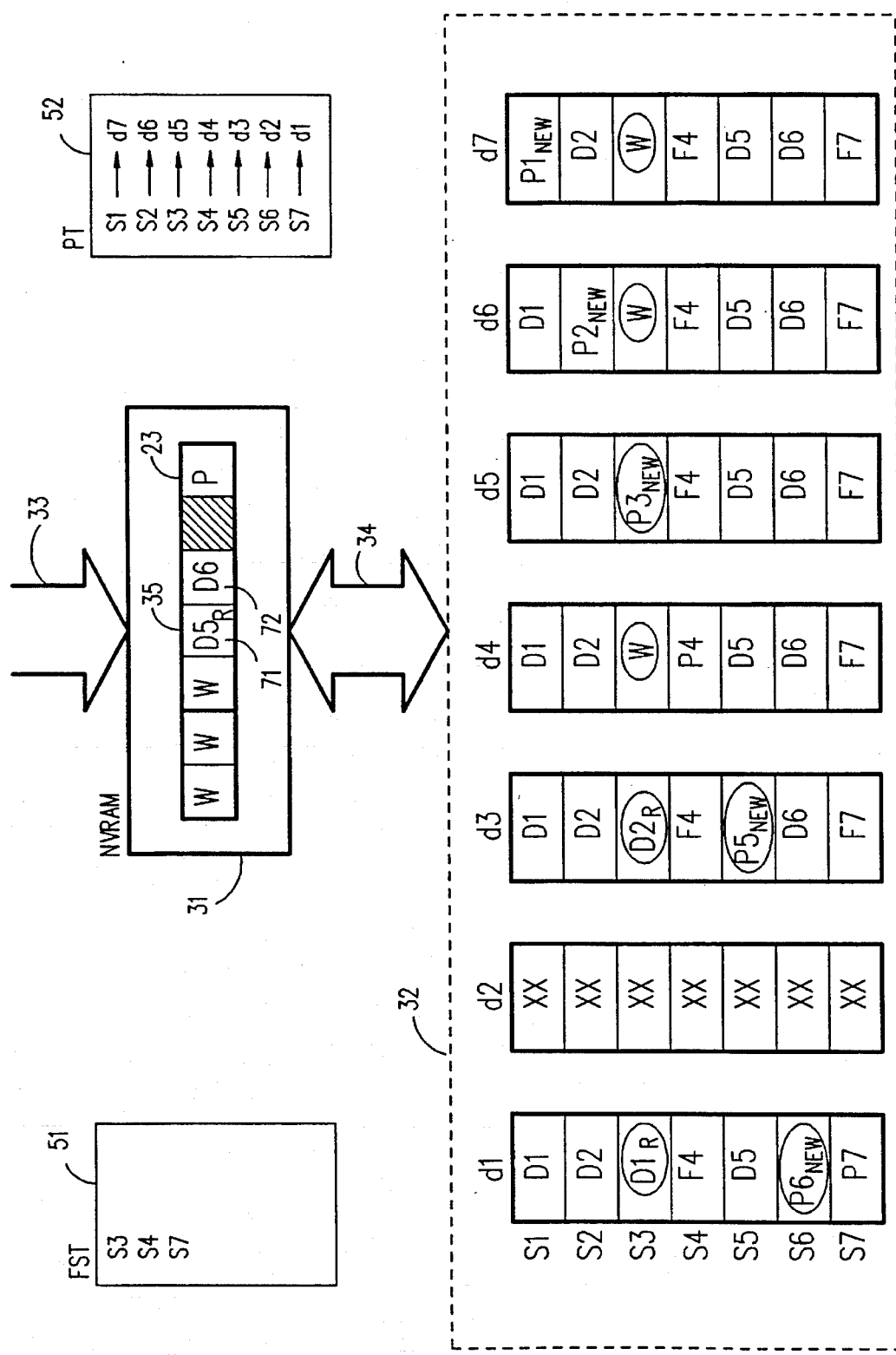

The procedure continues to segments S3 and S4, determines that they were free segments at the time of the device failure, and proceeds to segment S5. In the meantime, more incoming data is received in the write buffer, causing it to reach a full state. Write processing steps running concurrently with the recovery procedures cause a parity block 23 to be generated for all data in the buffer. The data and parity blocks of the write buffer 35 form a new parity group which will be written to a free segment of the array. Assuming that S3 is the next available segment, the new parity group is written to S3 as shown in FIG. 7, and S3 is removed from the original free segment table (not shown).

Returning to the recovery procedure of the present invention, lost data block D5 of the current segment S5 is reconstructed according to the same restoration sequences as the lost data blocks of segments S1 and S2. The reconstructed block, $D5_R$ 71, is placed in the write buffer 35 as shown, and newly generated parity block $P5_{new}$ replaces the old P5 parity block in device d3.

Figure 8:
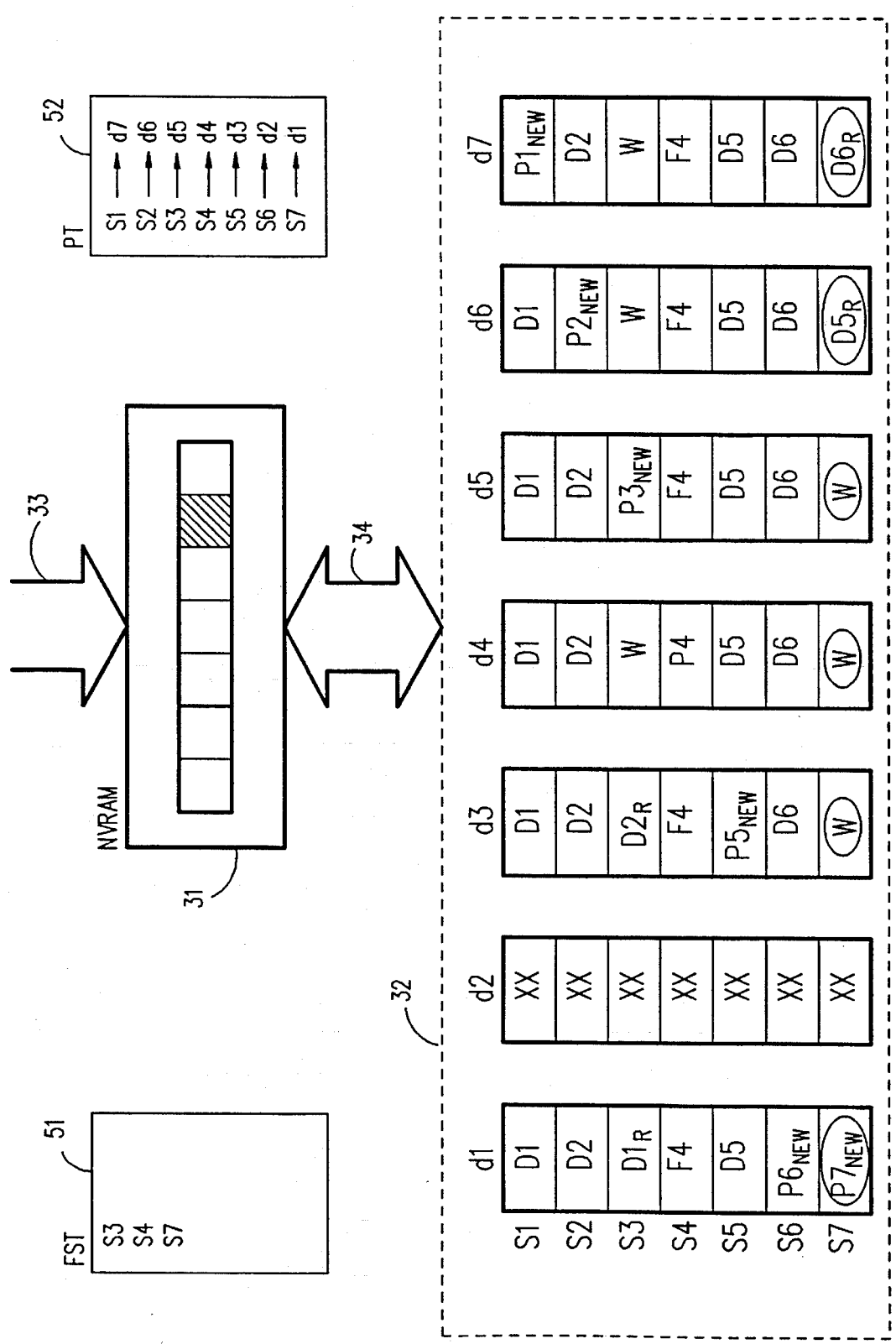

Proceeding to segment S6 and determining that it is not a free segment, a second determination is made that the lost block was a parity block because its location corresponds to that listed in the parity table 52 for segment S6. Consequently, the alternative restoration sequence 46 of FIG. 4 is executed. First, one data block D6 72 is transferred from the current segment to the write buffer 35. In the present example, the data block of device d1 was selected for removal to the write buffer. However, any other data block of segment S6 could have been removed. Next, parity is generated for the data blocks remaining in segment S6 and the new parity block, $P6_{new}$, is placed in the freed segment column of device d1, as shown. Placing the data segment D6 72 into the write buffer 35 causes it to be full. Concurrent write processing generates a parity block 23 for the new collection of data blocks. The newly formed parity block is then written to a free segment of the array. Assuming that the next available segment is S7, the contents of buffer 35 are written to S7 as shown in FIG. 8. S7 is then removed from the original free segment table (not shown).

Recovery processing continues to segment S7. Segment S7 is compared to the free segment table 51 and is determined to have been a free segment at the time of the device failure. Since it is the last segment of the array, the recovery procedure terminates. When the failed device is eventually replaced, each N+P−1 parity group of the array is converted back to an N+P array, e.g. by restoring the write buffer to its original size and allowing the normal write process to effect the conversion.

To summarize the recovery method of the present invention, free segments of the array serve the function distributed of dedicated spare space in an LSA, eliminating the need for these additional elements and thereby increasing the subsystem data capacity. This result is achieved by converting each N+P parity group of the array to an N+P−1 group, reconstructing lost blocks according to traditional methods, and then processing the reconstructed blocks in the same manner as new write data rather than immediately placing them into spare space. Upon replacement of the failed drive, each N+P−1 parity group is restored to an N+P group. The recovery method may also be invoked at physical removal of a device from the array.

Although the recovery procedure of the present invention has been described with reference to a preferred embodiment, it will be apparent that equivalent substitutions and modifications may be made to portions thereof without departing from the spirit and scope of the present invention.

We claim:

1. In a log structured array (LSA) comprising a plurality of storage devices configured in a plurality of segments, wherein a plurality of parity groups are distributed to some of said segments, each parity group comprising a plurality of data block and a parity block, and wherein others of said segments are free, a method for restoring lost ones of said blocks, comprising the steps of:

detecting a failure in one of said plurality of storage devices;

copying a free segment table to a temporary storage to preserve the state of said free segment table at the time of said failure;

testing each segment in said array against said copy of said free segment table, to determine if said segment stores a parity group;

determining whether a lost segment column in said parity group is a data block or a parity block;

generating a reconstructed data block, if said lost column is determined to be a data block;

generating a new parity block from data blocks in said parity group; and storing said reconstructed data block and said new parity block in free segments in said array.

2. The method of claim 1, wherein each lost data block is reconstructed by exclusive OR-ing said remaining of said data and parity blocks of the same parity group.

3. The method of claim 1, wherein said storage devices are organized by a plurality of physical addresses, said LSA further comprising an updatable LSA directory containing a current list of said data blocks and those of said physical addresses corresponding to said data blocks, wherein said corresponding physical addresses for said reconstructed data blocks are updated.

4. The method of claim 1, wherein said LSA further comprises a write buffer for temporarily storing a predetermined number of data blocks to be stored in said LSA, including means for generating a parity block therefrom to form a new parity group.

5. The method of claim 4, wherein said placing step further comprises temporarily storing said reconstructed data blocks in said write buffer, forming a plurality of new parity groups comprising said reconstructed data blocks, and writing each new parity group to one of said free segments.

6. The method of claim 5, wherein some of said new parity groups further comprise a portion of new write data from a host processor linked to said LSA.

7. The method of claim 5, wherein some of said new parity groups further comprise a portion of modified write data from a host processor linked to said LSA.

8. The method of claim 4, wherein a lost parity block is restored by copying one of said remaining data blocks of the same parity group into said write buffer, generating a new parity block from the other of said remaining data blocks, and replacing said copied data block in said array with said new parity block.

9. The method of claim 8, wherein said new parity block is generated by exclusive OR-ing said other remaining data blocks.

10. The method of claim 1, wherein said free segments are freed by a garbage collection procedure implemented in said LSA.

11. The method of claim 1, further comprising the step of generating a new parity block for said remaining data blocks of the same parity group, and replacing said remaining parity block with said new parity block.

12. The method of claim 11, wherein said new parity block is generated by exclusive OR-ing said remaining data blocks of the same parity group.

13. The method of claim 1, wherein said array further comprises a plurality of magnetic disk drives.

14. The method of claim 1, wherein said array further comprises a plurality of optical disk drives.

15. The method of claim 1, wherein said array further comprises a plurality of optical and magnetic disk drives.

16. A method according to claim 1, further comprising the step of:

generating a new parity block from data blocks in said parity group if said lost column is determined to be a parity block.

17. A log structured storage array comprising:

a plurality of storage devices configured in a plurality of segments, wherein a plurality of parity groups are distributed to some of said segments, each parity group comprising a plurality of data blocks and a parity block, and wherein others of said segments are free;

means for detecting a failure in one of said plurality of storage devices;

means for copying a free segment table to a temporary storage to preserve the state of said free segment table at the time of said failure;

means for testing each segment in said array against said copy of said free segment table to determine if said segment stores a parity group;

means for determining whether a lost segment column in said parity group is a data block or a parity block;

means for generating a reconstructed data block; and means for generating a new parity block from data blocks in said parity group.

18. The LSA of claim 17, wherein said means for reconstructing each lost data block further comprises means for exclusive OR-ing said remaining of said data and parity blocks of the same parity group.

19. The LSA of claim 17, wherein said storage devices are organized by a plurality of contiguous physical addresses, said LSA further comprising an updatable LSA directory containing a current list of said data blocks, and those of said physical addresses corresponding to said data blocks, wherein said corresponding physical addresses for said reconstructed data blocks are updated.

20. The LSA of claim 17, further comprising a write buffer for temporarily storing a predetermined number of data blocks to be stored in said LSA, including means for generating a parity block therefrom to form a new parity group.

21. The LSA of claim 20, wherein said means for placing said reconstructed blocks further comprises means for temporarily storing said reconstructed data blocks in said write buffer, means for forming a plurality of new parity groups comprising said reconstructed data blocks, and means for writing each new parity group to one of said free segments.

22. The LSA of claim 21, wherein some of said new parity groups include a portion of new write data from a host processor linked to said LSA.

23. The LSA of claim 21, wherein some of said new parity groups include a portion of modified write data from a host processor linked to said LSA.

24. The LSA of claim 20, further comprising means for restoring a lost parity block, including means for copying one of said remaining data blocks of the same parity group into said write buffer, means for generating a new parity block from the other of said remaining data blocks, and means for replacing said copied data block in said array with said new parity block.

25. The LSA of claim 24, wherein said means for generating a new parity further comprises means for exclusive OR-ing said other remaining data blocks.

26. The LSA of claim 17, wherein said free segments are freed by a garbage collection procedure implemented in said LSA.

27. The LSA of claim 17, further comprising means for generating a new parity block for said remaining data blocks of the same parity group, and means for replacing said remaining parity block with said new parity block.

28. The LSA of claim 27, wherein said means for generating a new parity block further comprise means for exclusive OR-ing said remaining data blocks of the same parity group.

29. The LSA of claim 17, wherein said array further comprises a plurality of magnetic disk drives.

30. The LSA of claim 17, wherein said array further comprises a plurality of optical disk drives.

31. The LSA of claim 17, wherein said array further comprises a plurality of optical and magnetic disk drives.

* * * * *